(12) United States Patent
Deng (10) Patent No.: US 9,904,128 B2
(45) Date of Patent: Feb. 27, 2018

(54) MANUFACTURING METHOD FOR COA SUBSTRATE

(71) Applicant: Shenzhen China Star Optoelectronics Technology Co., Ltd., Shenzhen (CN)

(72) Inventor: Weijia Deng, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 231 days.

(21) Appl. No.: 15/023,692

(22) PCT Filed: Jan. 29, 2016

(86) PCT No.: PCT/CN2016/072785
§ 371 (c)(1),
(2) Date: Mar. 22, 2016

(87) PCT Pub. No.: WO2017/101206
PCT Pub. Date: Jun. 22, 2017

(65) Prior Publication Data
US 2018/0011364 A1 Jan. 11, 2018

(30) Foreign Application Priority Data
Dec. 17, 2015 (CN) .......................... 2015 1 0955635

(51) Int. Cl.
| H01L 21/00 | (2006.01) |
| G02F 1/1343 | (2006.01) |
| H01L 27/12 | (2006.01) |
| G02F 1/1335 | (2006.01) |
| G02F 1/1368 | (2006.01) |

(52) U.S. Cl.
CPC ........ *G02F 1/13439* (2013.01); *G02F 1/1368* (2013.01); *G02F 1/133516* (2013.01); *H01L 27/1259* (2013.01)

(58) Field of Classification Search
None
See application file for complete search history.

(56) References Cited

U.S. PATENT DOCUMENTS 6,111,623 A * 8/2000 Sato .................. G02F 1/133516
349/106

* cited by examiner

Primary Examiner — Jack Chen
(74) Attorney, Agent, or Firm — Leong C. Lei (57) ABSTRACT

The disclosure provides a manufacturing method for COA substrate: utilizing PEDOT, PProDOT or PEDOT derivatives with or without doping with graphene, or PProDOT derivatives replaces traditional ITO to be conductive materials of pixel electrodes; quantum dots can be modified by ProDOT derivatives or EDOT derivatives which including carboxyl group, and quantum dot color filters of red filter layers, green filter layer and blue filters layers comprised on the TFT substrate are formed by the method of electric chemical deposition based on a property of the aforementioned two being able to polymerize under influences of electric field and pixel electrode patterns on the TFT substrate. Therefore, zero waste can be achieved in quantum dots, a usage of quantum dots can be decreased, indium usage can be decreased, researching and development cost can be reduced, and the circumstances can be protected, furthermore, the QDs color film having the better bonding strength bonds the counter electrode layer through chemical bond, and avoids adverse results as a peel is caused by insufficient bonding strength between photoresist and substrate.

16 Claims, 6 Drawing Sheets

MANUFACTURING METHOD FOR COA SUBSTRATE

TECHNICAL FIELD

The present disclosure relates to the display technology field, in particular to a manufacturing method for COA (Color Filter on Array) substrate.

BACKGROUND

With the development of display technology, people request more and more display quality for display device. Quantum dots (refer to as QDs hereinafter) is spherical or spheroidal assemblies of semiconductor nanoparticles composed of II-VI group elements or III-V group elements, and particle diameter is generally between a few nanometers to tens of nanometers. The quantum confinement effect is occurred when the size of the particle of quantum dots are smaller or closed to the Exciton Bohr Radius of corresponding low-dimension materials, and the energy level of quasi-continuous of low-dimension materials turns into discrete structure of quantum dots materials to cause that QDs shows the property of special light amplification by stimulated emission of radiation. With the decreasing size of quantum dots and the increasing of band gap energy level, the energy that corresponding quantum dots need for exciting and the energy that quantum dots backs to ground state after excitation increases correspondingly and shows the excitation of quantum dots and blue shift of fluorescence spectroscopy; moreover, through controlling the size of quantum dots, photoluminescence spectroscopy may cover the entire visible spectrum. For example, the size of CdSe reduces to 2.0 nm from 6.6 nm, and the emission wavelength moves to 460 nm of blue spectrum from 635 nm of red spectrum by blue shift.

Advantages of quantum dots materials are centralized emission spectrum, high color purity and easy adjust light color through the size, structure or composition of quantum dots materials, and are used to effectively improve color gamut and color reproduction. Nowadays, it has been reported in many papers and patents that quantum dots are applied in Thin Film Transistor Liquid Crystal Display (TFT-LCD) area, wherein quantum dots substituted for color film materials gets people's attention. Using quantum dots to replace the traditional color resist may improve a great quantity of color gamut and penetration of TFT-LCD and have better display efficiency.

However, photoresist is made of composite resin resist quantum dots and then used to make quantum dots color film with following several problems: firstly, quantum dots has bad heat tolerance, and traditional TFT photolithography process goes through a temperature of over 200 degree. In order to make quantum dots photoresist be possible, the baked temperature of quantum dots photoresist must be decreased so that the ingredient of quantum dots photoresist should be a huge difference with traditional photoresist, and require a lot of research and development costs. Secondly, quantum dots are experience and toxic for most part, and large quantities of quantum dots are cleaned during photolithography process to cause waste and environment pollution. Once again, costly photolithography process may be used two or three times by using quantum dots photoresist.

COA (Color Filter on Array) is a technology that color layers are manufactured on the array substrate to form color filters. Alignment problem between color film substrate and array substrate is not existed in COA structure of display panel so that the difficulty of celling manufacturing process may decrease to avoid the error of alignment; hence, black array may be designed for narrow linewidth to improve aperture ratio.

PEDOT (poly-3,4-ethylene dioxythiophene) and PProDOT (poly-3,4-propylene dioxythiophene) are 3,4-substituted polythiophenes, and are a class of conductive polymer material having high electrical conductivity, and being stable and transparent under oxidation state. When graphene is mixed, graphene nanosheet having high conductivity and excellent mechanical properties may be used to improve conductivity, weatherability and hardness of PEDOT transparent conductive film. Besides, graphene nanosheet solution may well mix with PEDOT solution, may be used to form films by ordinary solution coating method and has actual prospects for industrial applications. Raw materials of graphene/PEDOT transparent conductive film are wide variety of sources, are simple manufacturing processes, are excellent performance, and may effectively replace ITO of which indium source is gradually lack; moreover, it reduces the use of PVD, decreases cost of production, and has huge marketing and prospects in flexible device.

SUMMARY

An object of the present disclosure is providing a manufacturing method for COA substrate; that a quantum dot color filter of red, green and blue color filter layers is formed on a TFT substrate by electric deposition compares with the traditional manufacturing method for present quantum dot color filters, usages of quantum dot can be less, cost is lower and the environment can be protected.

To achieve the aforementioned object, the present disclosure provides a manufacturing method for COA substrate, comprising following steps:

step 1. providing a TFT substrate which comprises a base substrate, a TFT layer disposed on the base substrate and a pixel electrode layer disposed on the TFT layer, wherein, the pixel electrode layer comprises a plurality of red subpixel electrodes, a plurality of green subpixel electrodes and a plurality of blue subpixel electrodes arranged in intervals;

wherein, materials of the pixel electrode layer are PEDOT, PProDOT or PEDOT derivatives with or without doping with graphene, or PProDOT derivatives;

forming a block array inside interval regions of the plurality of red subpixel electrodes, green subpixel electrodes and blue subpixel electrodes located on the TFT layer;

step 2. providing a counter electrode layer, a reference electrode, a first electrolytic solution, a second electrolytic solution and a third electrolytic solution; the counter electrode layer comprises an insulating substrate and a plurality of counter electrode layer units disposed on the insulating substrate, and the counter electrode layer units are respectively disposed in corresponding to the plurality of red, green and blue subpixel electrodes; the first electrolytic solution is an organic electrolytic solution of red quantum dot which is modified by a modifier, the second electrolytic solution is an organic electrolytic solution of green quantum dot which is modified by a modifier, and the third electrolytic solution is organic electrolytic solution of scattering particles which are modified by a modifier; the reference electrode is processed calibration via ferrocene before being utilized;

the chemical structural formulas of the modifier is:

wherein, all $R_1$, $R_2$, $R_3$ are hydrocarbyl groups containing 1 to 20 carbon atoms;

step 3. immersing the counter electrode layer, the reference electrode and the TFT substrate into the first electrolytic solution simultaneously, controlling circuit via connecting to the TFT substrate, the counter electrode layer and the reference electrode by wires, and applying positive voltages to all red subpixel electrodes on the TFT substrate; under oxidation of a positive electric field after being powered on, the modifier on the red quantum dot inside the first electrolytic solution nearby the red subpixel electrodes on the TFT substrate undergoes crosslinking reaction with the red subpixel electrodes, and each modifier undergoes crosslinking reaction with each other at the same time to deposit the red quantum dot on the red subpixel electrodes for further forming several red filter layers on several red subpixel electrodes; controlling electric chemical depositing time to have the thicknesses of the red filter layers achieved to a certain amount, and then being powered off to obtain the TFT substrate, the counter electrode layer and the reference electrode, and then cleaning the TFT substrate, the counter electrode layer and the reference electrode with organic solution;

step 4. immersing the counter electrode layer, the reference electrode and the TFT substrate into the second electrolytic solution simultaneously, controlling circuit via connecting to the TFT substrate, the counter electrode layer and the reference electrode by wires, and applying positive voltages to all green subpixel electrodes on the TFT substrate; under oxidation of a positive electric field after being powered on, the modifier on the green quantum dot inside the second electrolytic solution nearby the green subpixel electrodes on the TFT substrate undergoes crosslinking reaction with the green subpixel electrodes, and each modifier undergoes crosslinking reaction with each other at the same time to deposit the green quantum dot on the green subpixel electrodes for further forming several green filter layers on several green subpixel electrodes; controlling electric chemical depositing time to have the thicknesses of the green filter layers achieved to a certain amount, and then being powered off to obtain the TFT substrate, the counter electrode layer and the reference electrode, and then cleaning the TFT substrate, the counter electrode layer and the reference electrode with organic solution;

step 5. immersing the counter electrode layer, the reference electrode and the TFT substrate into the third electrolytic solution simultaneously, controlling circuit via connecting to the TFT substrate, the counter electrode layer and the reference electrode by wires, and applying positive voltages to all blue subpixel electrodes on the TFT substrate; under oxidation of a positive electric field after being powered on, the modifier on the scattering particles inside the third electrolytic solution nearby the blue subpixel electrodes on the TFT substrate undergoes crosslinking reaction with the blue subpixel electrodes, and each modifier undergoes crosslinking reaction with each other at the same time to deposit the scattering particles on the blue subpixel electrodes for further forming several blue filter layers on several blue subpixel electrodes; controlling electric chemical depositing time to have the thicknesses of the blue filter layers achieved to a certain amount, and then being powered off to obtain the TFT substrate, the counter electrode layer and the reference electrode, and then cleaning the TFT substrate, the counter electrode layer and the reference electrode with organic solution;

the step 3., step 4. and step 5 are processed randomly; after processing step 3.~step 5., a quantum dot color filter of several red filter layers, several green filter layers and glue filter layers can be obtained for further manufacturing a COA substrate.

Materials of the pixel electrode layer are PEDOT with doping with graphene;

the chemical structural formula of the modifier is:

wherein, $R_1$ is $CH_3$, R2 is $CH_2$, $R_3$ is

Diameters of the red quantum dot, the green quantum dot and the scattering particles are 2 nm~10 nm, the red quantum dot is an InP quantum dot covered by ZnS; the green quantum dot is an InAs quantum dot covered by ZnS; the scattering particles dot are white, blue or transparent particles.

During the depositing process in the step 3. to step 5., the positive potential applying to the red/green/blue subpixel electrodes on the TFT substrate is a stable potential of the reference electrode in a constant voltage of 0.7V~2V with applying time of 0.1 s~100 min.

During the electric depositing process in the step 3. to step 5., the positive potential applying to the red/green/blue subpixel electrodes on the TFT substrate is the highest voltage which is a pulsed electrical potential of 0.7V~2V with applying time of 0.1 s~100 min.

During the electric depositing process in the step 3. to step 5., the positive potential applying to the red/green/blue subpixel electrodes on the TFT substrate is a square wave pulse with a wave crest of 1.1V, a crest time of 0.1 s, a wave trough of 0.4V and a trough time of is in repeating 15 times.

The manufacturing method for the first, the second and the third electrolytic solutions is: firstly, processing modifications the red quantum dot, the green quantum dot and the scattering particles with pyridine, inputting an amount of 1 μM~10 mM red quantum dot, green quantum dot and scattering particles into organic electrolytic solutions respectively, adding 1 μM~10 mM modifier into the organic electrolytic solution, and then stirring for 10 min-12 h to obtain the red quantum dot, the green quantum dot and the scattering particles modified by modifier respectively.

The organic electrolytic solution is an ionic liquid or an organic solution containing an organic salt; the reference electrode is a Ag/Ag+ reference electrode.

The organic electrolytic solution is a tetrahydrofuran/acetonitrile solution with 0.01M silver nitrate and 0.1M tetrabutylammonium hexafluorophosphate, wherein, the volume ratio between tetrahydrofuran and acetonitrile is 2:1; the solution inside the reference electrode comprises a tetrahydrofuran/acetonitrile solution of 0.15M tetrabutylammonium hexafluorophosphate and 0.001M silver nitrate, wherein, the volume ratio between tetrahydrofuran and acetonitrile is 2:1.

In the step 3.-step 5., the TFT substrate, the counter electrode layer and the reference electrode are cleaned by acetonitrile.

The present disclosure further provides a manufacturing method for COA substrate, comprising following steps:

step 1. providing a TFT substrate which comprises a base substrate, a TFT layer disposed on the base substrate and a pixel electrode layer disposed on the TFT layer, wherein, the pixel electrode layer comprises a plurality of red subpixel electrodes, green subpixel electrodes and blue subpixel electrodes arranged in intervals;

wherein, materials of the pixel electrode layer are PEDOT, PProDOT or PEDOT derivatives with or without doping with graphene, or PProDOT derivatives;

forming a block array inside interval regions of the plurality of red subpixel electrodes, green subpixel electrodes and blue subpixel electrodes located on the TFT layer;

step 2. providing a counter electrode layer, a reference electrode, a first electrolytic solution, a second electrolytic solution and a third electrolytic solution; the counter electrode layer comprises an insulating substrate and a plurality of counter electrode layer units disposed on the insulating substrate, and the counter electrode layer units are respectively disposed in corresponding to the plurality of red, green and blue subpixel electrodes; the first electrolytic solution is an organic electrolytic solution of red quantum dot which is modified by a modifier, the second electrolytic solution is an organic electrolytic solution of green quantum dot which is modified by a modifier, and the third electrolytic solution is organic electrolytic solution of scattering particles which are modified by a modifier; the reference electrode is processed calibration via ferrocene before being utilized;

the chemical structural formulas of the modifier is:

wherein, all $R_1$, $R_2$, $R_3$ are hydrocarbyl groups containing 1 to 20 carbon atoms;

step 3. immersing the counter electrode layer, the reference electrode and the TFT substrate into the first electrolytic solution simultaneously, controlling circuit via connecting to the TFT substrate, the counter electrode layer and the reference electrode by wires, and applying positive voltages to all red subpixel electrodes on the TFT substrate; under oxidation of a positive electric field after being powered on, the modifier on the red quantum dot inside the first electrolytic solution nearby the red subpixel electrodes on the TFT substrate undergoes crosslinking reaction with the red subpixel electrodes, and each modifier undergoes crosslinking reaction with each other at the same time to deposit the red quantum dot on the red subpixel electrodes for further forming several red filter layers on several red subpixel electrodes; controlling electric chemical depositing time to have the thicknesses of the red filter layers achieved to a certain amount, and then being powered off to obtain the TFT substrate, the counter electrode layer and the reference electrode, and then cleaning the TFT substrate, the counter electrode layer and the reference electrode with organic solution;

step 4. immersing the counter electrode layer, the reference electrode and the TFT substrate into the second electrolytic solution simultaneously, controlling circuit via connecting to the TFT substrate, the counter electrode layer and the reference electrode by wires, and applying positive voltages to all green subpixel electrodes on the TFT substrate; under oxidation of a positive electric field after being powered on, the modifier on the green quantum dot inside the second electrolytic solution nearby the green subpixel electrodes on the TFT substrate undergoes crosslinking reaction with the green subpixel electrodes, and each modifier undergoes crosslinking reaction with each other at the same time to deposit the green quantum dot on the green subpixel electrodes for further forming several green filter layers on several green subpixel electrodes; controlling electric chemical time to have the thicknesses of the green filter layers achieved to a certain amount, and then being powered off to obtain the TFT substrate, the counter electrode layer and the reference electrode, and then cleaning the TFT substrate, the counter electrode layer and the reference electrode with organic solution;

step 5. immersing the counter electrode layer, the reference electrode and the TFT substrate into the third electrolytic solution simultaneously, controlling circuit via connecting to the TFT substrate, the counter electrode layer and the reference electrode by wires, and applying positive voltages to all blue subpixel electrodes on the TFT substrate; under oxidation of a positive electric field after being powered on, the modifier on the scattering particles inside the third electrolytic solution nearby the blue subpixel electrodes on the TFT substrate undergoes crosslinking reaction with the blue subpixel electrodes, and each modifier undergoes crosslinking reaction with each other at the same time to deposit the scattering particles on the blue subpixel electrodes for further forming several blue filter layers on several blue subpixel electrodes; controlling electric chemical time to have the thicknesses of the blue filter layers achieved to a certain amount, and then being powered off to obtain the TFT substrate, the counter electrode layer and the reference electrode, and then cleaning the TFT substrate, the counter electrode layer and the reference electrode with organic solution;

the step 3., step 4. and step 5 are processed randomly; after processing step 3.~step 5., a quantum dot color filter of several red filter layers, several green filter layers and glue filter layers can be obtained for further manufacturing a COA substrate;

wherein, materials of the pixel electrode layer are PEDOT with doping with graphene; the chemical structural formula of the modifier is:

wherein, $R_1$ is $CH_3$, R2 is $CH_2$, $R_3$ is wherein, diameters of the red quantum dot, the green quantum dot and the scattering particles are 2 nm-10 nm, the red quantum dot is an InP quantum dot covered by ZnS; the green quantum dot is an InAs quantum dot covered by ZnS; the scattering particles dot are white, blue or transparent particles;

wherein, the manufacturing method for the first, the second and the third electrolytic solutions is: firstly, processing modifications the red quantum dot, the green quantum dot and the scattering particles with pyridine, inputting an amount of 1 μM~10 mM red quantum dot, green quantum dot and scattering particles into organic electrolytic solutions respectively, adding 1 μM~10 mM modifier into the organic electrolytic solution, and then stirring for 10 min-12 h to obtain the red quantum dot, the green quantum dot and the scattering particles respectively modified by modifier;

wherein, the organic electrolytic solution is an ionic liquid or an organic solution containing an organic salt; the reference electrode is a Ag/Ag+ reference electrode.

Beneficial effects of the present disclosure: in the COA manufacturing method for COA substrate in the present disclosure, utilizing PEDOT, PProDOT or PEDOT derivatives with or without doping with graphene, or PProDOT derivatives replaces traditional ITO to be conductive materials of pixel electrodes; quantum dots can be modified by ProDOT derivatives or EDOT derivatives which including carboxyl group, and quantum dot color filters of red filter layers, green filter layer and blue filters layers comprised on the TFT substrate are formed by the method of electric chemical deposition based on a property of the aforementioned two being able to polymerize under influences of electric field and pixel electrode patterns on the TFT substrate. Quantum dots are dispersed in the electrolytic solution before forming film, and there is no other change in the nature in addition to decreased quantum dots concentration before and after forming film. In addition, the electrolytic solution may continue to use after supplying quantum dots so that zero waste is achieved, and compare to the present manufacturing method for color filter film, high temperature process is not necessary, utilization of Quantum dots are improved effectively, two or three photolithography processes may be saved simultaneously, and thereby the cost is reduced and the environment is protected; also, the QDs color film having the better bonding strength bonds the counter electrode layer through chemical bond, and avoids adverse results as a peel is caused by insufficient bonding strength between photoresist and substrate.

BRIEF DESCRIPTION OF THE DRAWINGS

The present disclosure is described in detail by specific embodiment with reference to the accompanying drawings, and the present disclosure will be enable technology and other obvious benefits.

DETAILED DESCRIPTION

To further set forth the technical solution adopted by the present disclosure and the effects thereof, the present disclosure is described in detail with reference to the following preferred embodiments and the accompanying figures.

The present invention is achieved based on the following principles:

ProDOT and EDOT are respectively two monomers, PProDOT and PEDOT, of conductive polymers, and crosslinking reactions can be occurred between them and PProDOT, PEDOT and PEDOT derivatives or PProDOT derivatives, wherein, the chemical structural formulas of PEDOT is:

the chemical structural formulas of PProDOT is:

at the same time, crosslinking reactions can be occurred between ProDOT and EDOT each other at the same circumstances. In additional, carboxyl can be involved in coordination with quantum dot, therefore, EDOT derivatives or ProDOT derivatives including carboxyl groups can be used to modify the quantum dots, and can further occur crosslinking reactions with PProDOT, PEDOT and PEDOT derivatives or PProDOT derivatives. Therefore, immersing electrodes (hereinafter named PEDOT type electrodes) taken from PProDOT, PEDOT and PEDOT derivatives or PProDOT derivatives into a solution of quantum dots modified by carboxyl derivatives of EDOT or ProDOT, and applying positive voltages to the counter electrode layer to electric deposit the quantum dots on the PEDOT type electrodes; in TFT-LCD, there are pixel electrodes cover fully on the TFT array substrate, and every pixel electrode corresponds to a subpixel, and then a voltage and a current of the pixel electrode corresponded to every subpixel can be controlled precisely by controlling a corresponded voltage and a corresponded current of the source and a corresponded voltage of the grid in the TFT; therefore, corresponded mono-color quantum dot film formed on the pixel electrode corresponded to every subpixel can be achieved by electric chemical deposition based on utilizing the pixel electrode pattern on current TFT array substrate to further form quantum dot color filters.

Figure 1:
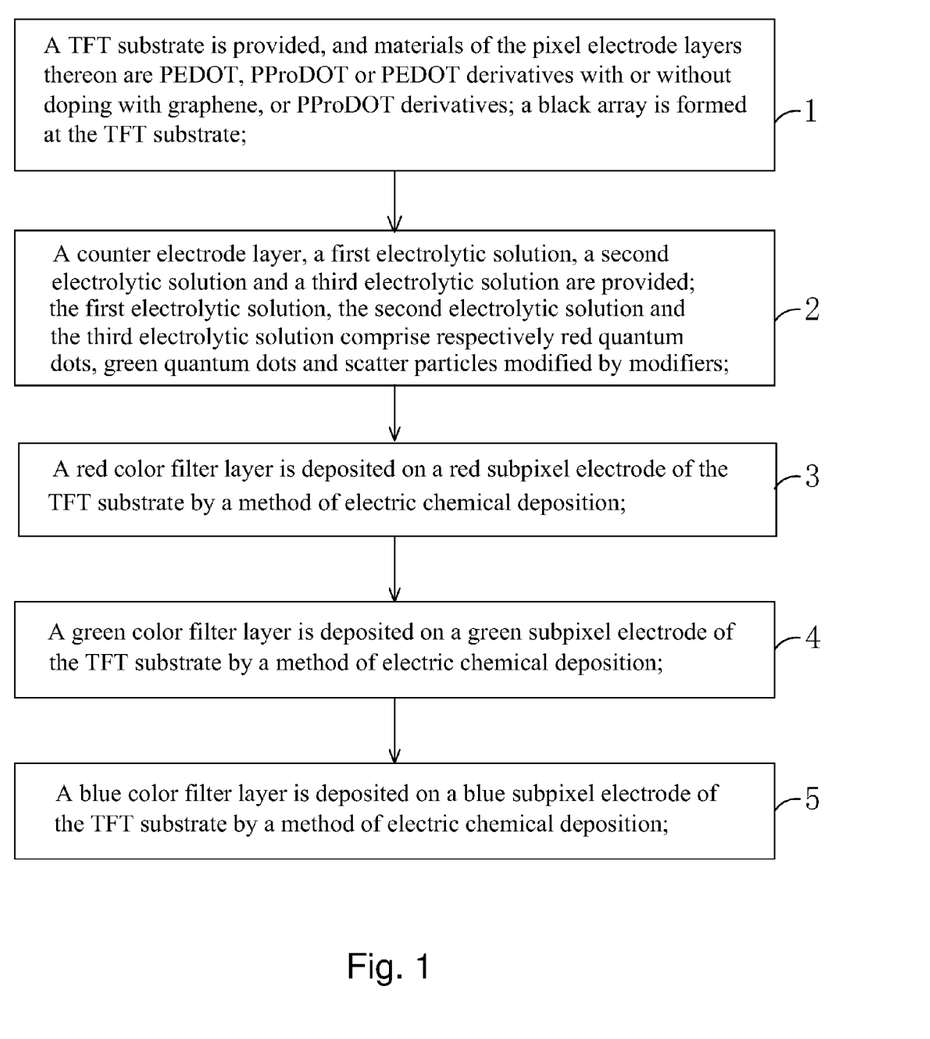
FIG. 1 is a schematic flowchart showing a manufacturing method of COA for the present disclosure.
Figure 2:
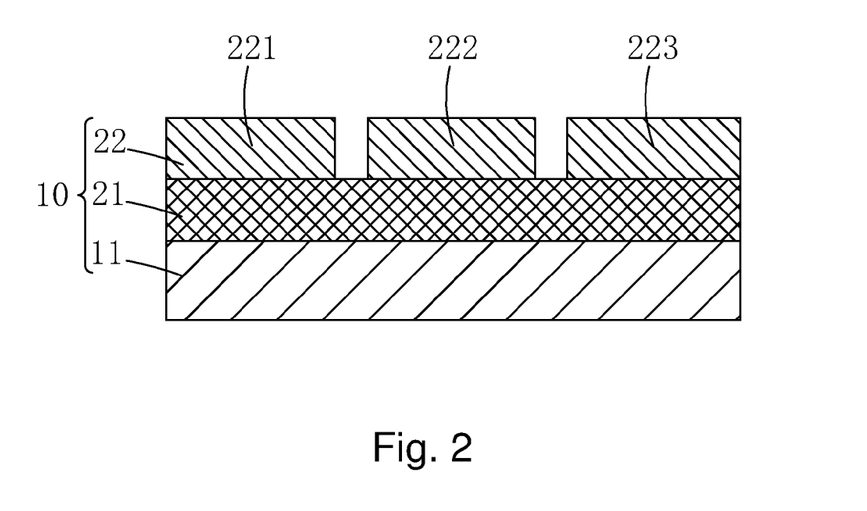
FIG. 2-FIG. 3 are schematic diagrams showing step.1 in the manufacturing method of COA for the present disclosure.
Figure 3:
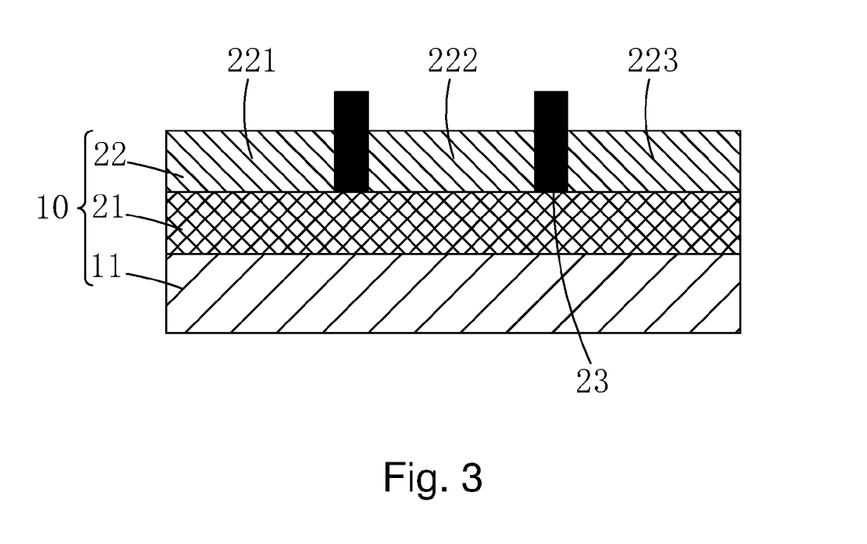

A chemical reaction of crosslinking reaction occurred between ProDOT derivatives including carboxyl and PEDOT in electric field is:

A chemical reaction of crosslinking reaction occurred to ProDOT derivatives including carboxyl in electric field is:

Please refer to FIG. 1, the present disclosure provide a manufacturing method for COA substrate, comprising following steps:

step 1. as shown in FIG. 2, providing a TFT substrate 10 which comprises a base substrate 11, a TFT layer 21 disposed on the base substrate 11 and a pixel electrode layer 22 disposed on the TFT layer 21, wherein, the pixel electrode layer 22 comprises a plurality of red subpixel electrodes 221, a plurality of green subpixel electrodes 222 and a plurality of blue subpixel electrodes 223 arranged in intervals;

wherein, materials of the pixel electrode layer 22 are PEDOT, PProDOT or PEDOT derivatives with or without doping with graphene, or PProDOT derivatives; preferably, materials of the pixel electrode layer 22 are PEDOT with doping with graphene;

as shown in FIG. 3, forming a block array 23 inside interval regions of the plurality of red subpixel electrodes 221, green subpixel electrodes 222 and blue subpixel electrodes 223 located on the TFT layer; the electric deposited region in the following steps can be restricted by the preformed block array 23 at gaps between every subpixel on the TFT substrate 10 to solve a problem of irregular edges occurred by electric deposition.

In particular, the TFT layer 21 comprises several TFTs corresponded to several red, green and blue subpixel electrodes 221, 222, and 223 respectively.

Figure 4:
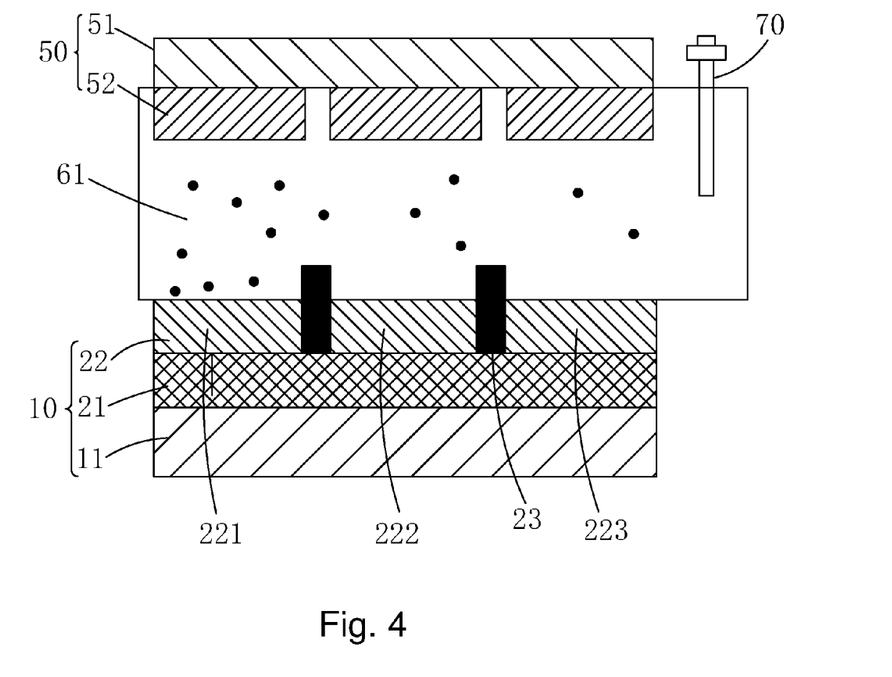
FIG. 4-FIG. 5 are schematic diagrams showing step.3 in the manufacturing method of COA for the present disclosure.
Figure 6:
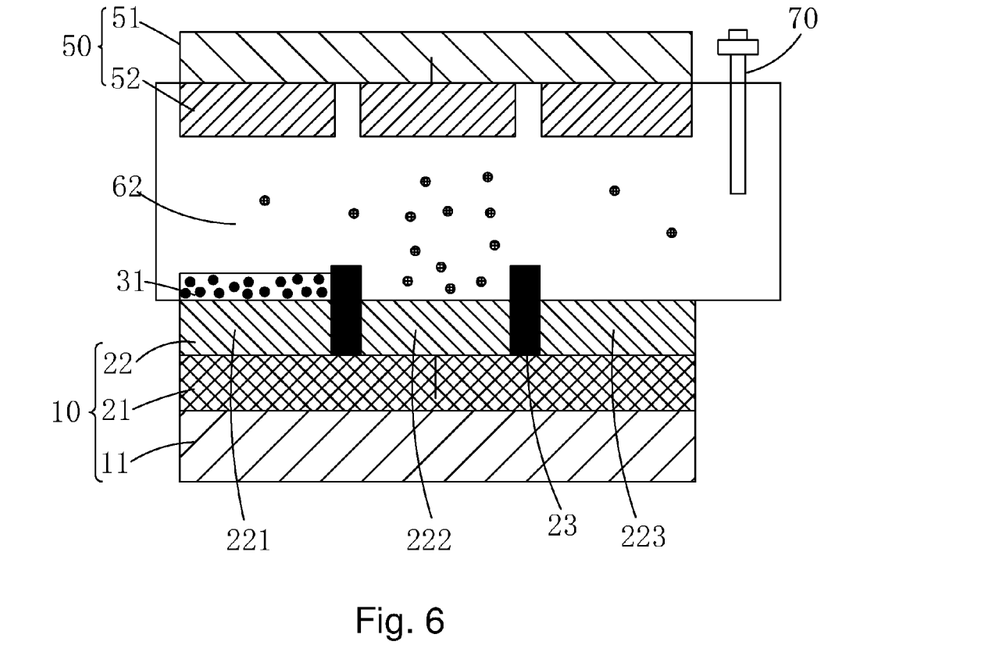
FIG. 6-FIG. 7 are schematic diagrams showing step.4 in the manufacturing method of COA for the present disclosure.
Figure 8:
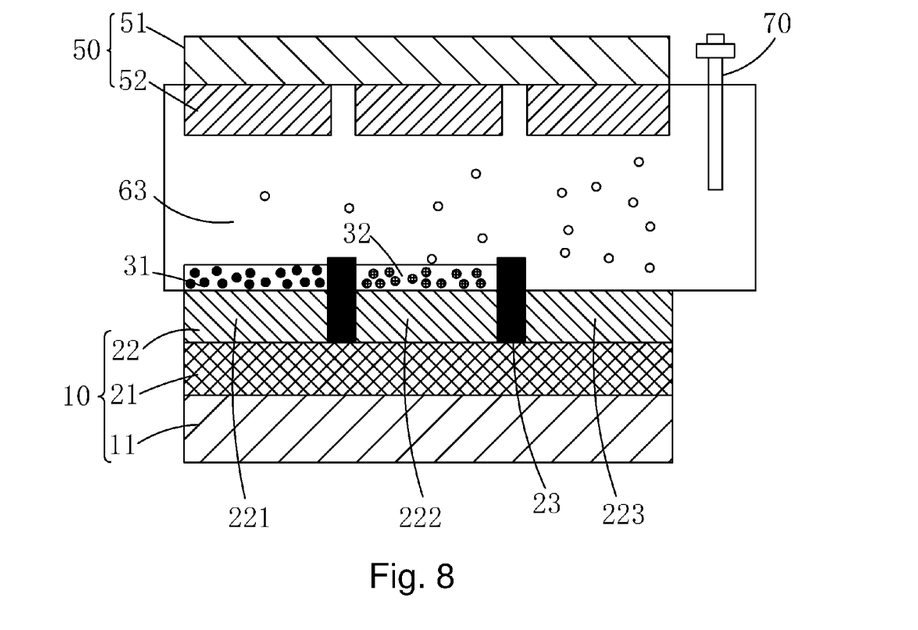
FIG. 8-FIG. 9 are schematic diagrams showing step.5 in the manufacturing method of COA for the present disclosure.

Step 2. as shown in FIG. 4, FIG. 6 and FIG. 8, providing a counter electrode layer 50, a reference electrode 70, a first electrolytic solution 61, a second electrolytic solution 62 and a third electrolytic solution 63; the counter electrode layer 50 comprises an insulating substrate 51 and a plurality of counter electrode layer units 52 disposed on the insulating substrate 51, and the counter electrode layer units 52 are respectively disposed in corresponding to the plurality of red, green and blue subpixel electrodes 221, 222 and 223; the first electrolytic solution 61 is an organic electrolytic solution of red quantum dot which is modified by a modifier, the second electrolytic solution 62 is an organic electrolytic solution of green quantum dot which is modified by a modifier, and the third electrolytic solution 63 is organic electrolytic solution of scattering particles which are modified by a modifier; the reference electrode is processed calibration via ferrocene before being utilized;

the chemical structural formulas of the modifier is:

wherein, all $R_1$, $R_2$, $R_3$ are hydrocarbyl groups containing 1 to 20 carbon atoms; preferably, the chemical structural formulas of the modifier is:

wherein, $R_1$ is $CH_3$, R2 is $CH_2$, $R_3$ is

In particular, materials of the counter electrode layer units 52 can be conductive materials which is insoluble to organic solution, comprising but not limited to indium-tin oxide (ITO), aluminum doped zinc oxide (AZO), Nickel (Ni), stainless steel, silver (Ag), gold (Au) or platinum (Pt); preferably, materials of the electrode units is gold or platinum.

Preferably, sizes and shapes of the counter electrode layer units 52 are the same as the red, green and blue subpixel electrodes 221, 222 and 223;

in particular, the red quantum dots are quantum dots capable of emitting red fluorescence light used to cover InP quantum dots of ZnS preferably; the green quantum dots are quantum dots capable of emitting green fluorescence light used to cover InAs quantum dots of ZnS preferably; the scattering particles are white, blue or transparent particles, and the scattering particles are resin particles preferably.

In particular, diameters of the red quantum dot, the green quantum dot and the scattering particles are 2 nm~10 nm.

In particular, the manufacturing method for the first, the second and the third electrolytic solutions 61, 62 and 63 is: firstly, processing modifications the red quantum dot, the green quantum dot and the scattering particles with pyridine, inputting an amount of 1 μM~10 mM red quantum dot, green quantum dot and scattering particles into organic electrolytic solutions respectively, adding 1 μM~10 mM modifier into the organic electrolytic solution, and then stirring for 10 min-12 h to obtain the red quantum dot, the green quantum dot and the scattering particles modified by modifier respectively. Preferably, the added modifier amount is counted based on the surface modified density, $10^{-10}$ mol/cm$^2$, of quantum dots/scattering particles; for example, regarding to a quantum dot/scattering particles of 5 nm diameter, the amount adding modifiers is 50 times molar weight of quantum dot/scattering particles with modified reacting time of 30 min.

Preferably, concentrations of the first, second and third electrolytic solutions are 1 μM~10 mM, and preferably 10 μM.

In particular, the organic electrolytic solution is an ionic liquid or an organic solution containing an organic salt; the reference electrode is a Ag/Ag+ reference electrode; preferably, the organic electrolytic solution is a tetrahydrofuran/acetonitrile solution with 0.01M silver nitrate and 0.1M tetrabutylammonium hexafluorophosphate, wherein, the volume ratio between tetrahydrofuran and acetonitrile is 2:1; the solution inside the reference electrode comprises a tetrahydrofuran/acetonitrile solution of 0.15M tetrabutylammonium hexafluorophosphate and 0.001M silver nitrate, wherein, the volume ratio between tetrahydrofuran and acetonitrile is 2:1.

Figure 5:
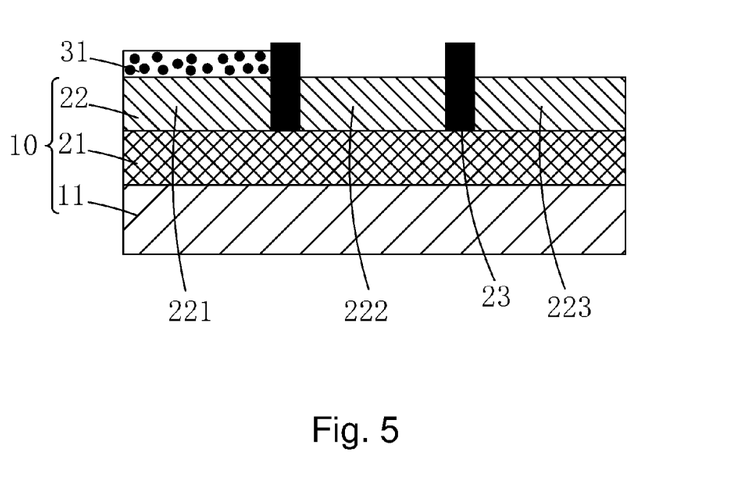
Figure 7:
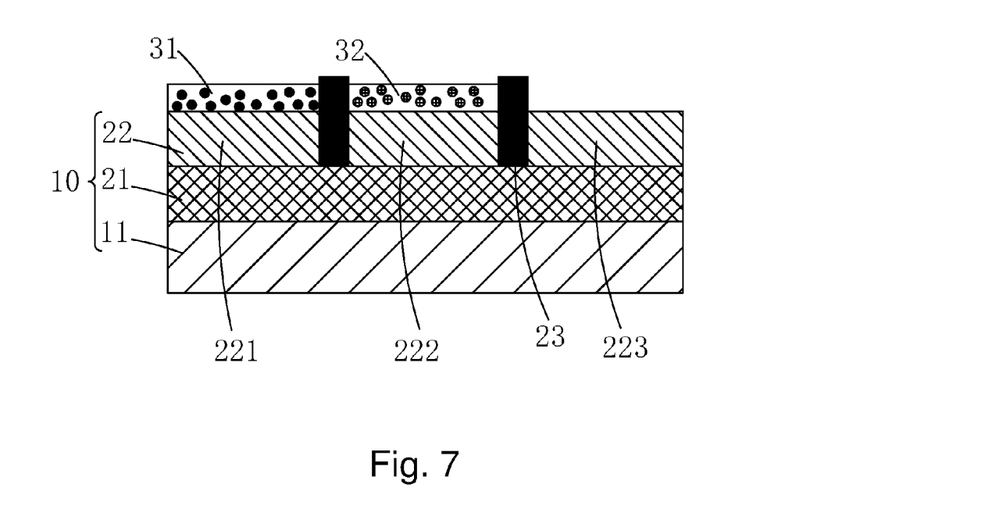
Figure 9:
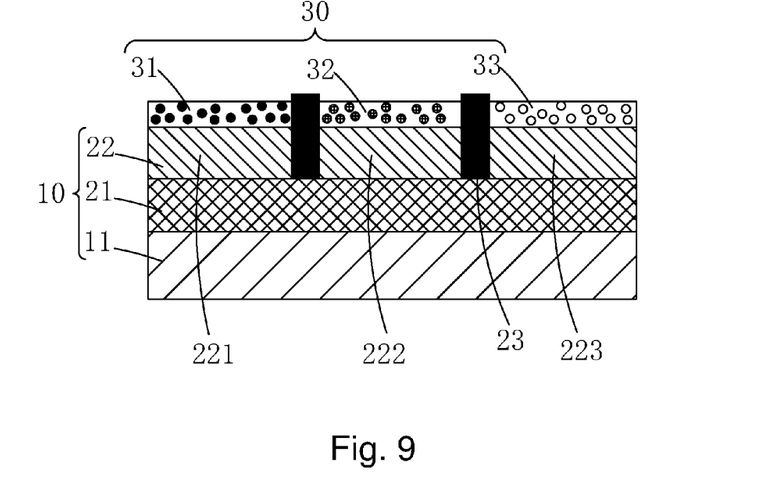

Step 3., as shown in FIG. 4-FIG. 5, immersing the counter electrode layer 50, the reference electrode 70 and the TFT substrate 10 into the first electrolytic solution 61 simultaneously, controlling circuit via connecting to the TFT substrate 10, the counter electrode layer 50 and the reference electrode 70 by wires, and applying positive voltages to all red subpixel electrodes 221 on the TFT substrate 10; under oxidation of a positive electric field after being powered on, the modifier on the red quantum dot inside the first electrolytic solution 61 nearby the red subpixel electrodes 221 on the TFT substrate 10 undergoes crosslinking reaction with the red subpixel electrodes 221, and each modifier undergoes crosslinking reaction with each other at the same time to deposit the red quantum dot on the red subpixel electrodes 221 for further forming several red filter layers 31 on several red subpixel electrodes 221; controlling electric chemical depositing time to have the thicknesses of the red filter layers 31 achieved to a certain amount, and then being powered off to obtain the TFT substrate 10, the counter electrode layer 50 and the reference electrode 70, and then cleaning the TFT substrate 10, the counter electrode layer 50 and the reference electrode 70 with organic solution;

step 4., as shown in FIG. 6-FIG. 7, immersing the counter electrode layer 50, the reference electrode 70 and the TFT substrate 10 into the second electrolytic solution 62 simultaneously, controlling circuit via connecting with the TFT substrate 10, the counter electrode layer 50 and the reference electrode 70 by wires, and applying positive voltages to all green subpixel electrodes 222 on the TFT substrate 10; under oxidation of a positive electric field after being powered on, the modifier on the green quantum dot inside the second electrolytic solution 62 nearby the green subpixel electrodes 222 on the TFT substrate 10 undergoes crosslinking reaction with the green subpixel electrodes 222, and each modifier undergoes crosslinking reaction with each other at the same time to deposit the green quantum dot on the green subpixel electrodes 222 for further forming several green filter layers 32 on several green subpixel electrodes 222; controlling electric chemical time to have the thicknesses of the green filter layers 32 achieved to a certain amount, and then being powered off to obtain the TFT substrate 10, the counter electrode layer 50 and the reference electrode 70, and then cleaning the TFT substrate 10, the counter electrode layer 50 and the reference electrode 70 with organic solution;

step 5., as shown in FIG. 8-FIG. 9, immersing the counter electrode layer 50, the reference electrode 70 and the TFT substrate 10 into the third electrolytic solution 63 simultaneously, controlling circuit via connecting with the TFT substrate 10, the counter electrode layer 50 and the reference electrode 70 by wires, and applying positive voltages to all blue subpixel electrodes 223 on the TFT substrate 10; under oxidation of a positive electric field after being powered on, the modifier on the scattering particles inside the third electrolytic solution 63 nearby the blue subpixel electrodes 223 on the TFT substrate 10 undergoes crosslinking reaction with the blue subpixel electrodes 10, and each modifier undergoes crosslinking reaction with each other at the same time to deposit the scattering particles on the blue subpixel electrodes 223 for further forming several blue filter layers 33 on several blue subpixel electrodes 223; controlling electric chemical time to have the thicknesses of the blue filter layers 33 achieved to a certain amount, and then being powered off to obtain the TFT substrate 10, the counter electrode layer 50 and the reference electrode 70, and then cleaning the TFT substrate 10, the counter electrode layer 50 and the reference electrode 70 with organic solution;

the step 3., step 4. and step 5 are processed randomly; after processing step 3.~step 5., a quantum dot color filter 30 of several red filter layers 31, several green filter layers 32 and glue filter layers 33 can be obtained for further manufacturing a COA substrate.

In particular, during the electric depositing process in the step 3. to step 5., the positive potential applying to the red/green/blue subpixel electrodes 221/222/223 on the TFT substrate is a stable potential of the reference electrode in a constant voltage of 0.7V~2V or the highest voltage which is a pulsed electrical potential of 0.7V~2V with applying time of 0.1 s~100 min; in particular, in order to have the color filter 30 even more flat and to keep the electrical properties of the pixel electrode layer 22, the positive potential applying to the red/green/blue subpixel electrodes 221/222/223 on the TFT substrate 10 is a square wave pulse with a wave crest of 1.1V, a crest time of 0.1 s, a wave trough of 0.4V and a trough time of is in repeating 15 times.

In particular, in order to ensure the thickness of the color filter 30, the first, second and the third electrolytic solutions 61, 62 and 63 further comprise free modifiers, wherein, the adding amount of the modifiers is 0-100 mM, preferably, is 20 μM.

In particular, in the step 3.-step 5., the TFT substrate 10, the counter electrode layer 50 and the reference electrode 70 are cleaned by advanced organic solution, preferably acetonitrile.

Figure 10:
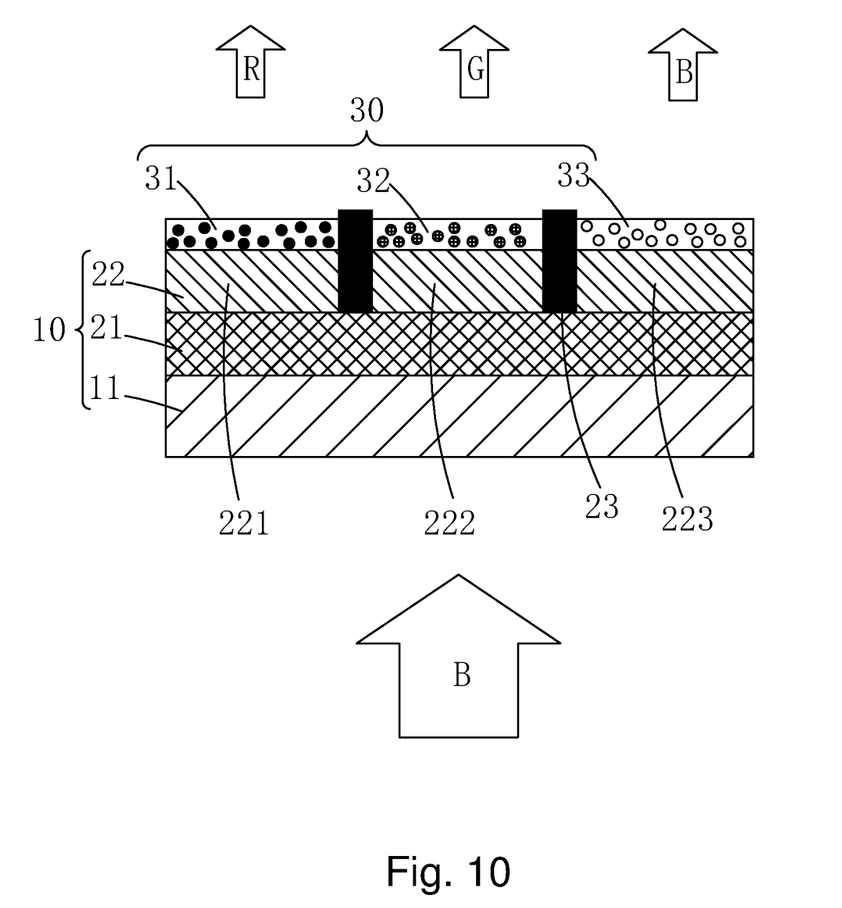
FIG. 10 is a schematic diagram showing the COA manufactured from the present disclosure and used in the colorful display.

As shown in FIG. 10, when the quantum dot color filter 30 used in colorful display, the red quantum dots inside the red color filter 31 emit red light under blue backlight irradiations to show red light, the green quantum dots inside the green color filter 32 emit green light under blue backlight irradiations to show green light, the blue color filter 33 doesn't radiate herein, and the blue backlight display blue color after passing through the blue color filter 33 to achieve colorful display.

In view of the aforementioned descriptions, the present disclosure provides the manufacturing method for COA substrate: forming quantum dot color filters of red filter layers, green filter layer and blue filter layer on the TFT substrate via electric chemical deposition by utilizing pixel electrode patterns and a property changing with pH value in chitosan. Quantum dots are dispersed in the electrolytic solution before forming film, and there is no other change in the nature in addition to decreased quantum dots concentration before and after forming film. In addition, the electrolytic solution may continue to use after supplying quantum dots so that zero waste is achieved, and compare to the present manufacturing method for color filter film, high temperature process is not necessary, utilization of quantum dots are improved effectively, two or three photolithography processes may be saved simultaneously, and thereby the cost is reduced and the environment is protected. In the COA substrate of the present disclosure, quantum dot color filters can be formed on the pixel electrode layer to showing good efficiencies of color display; therefore, an alignment issue between a traditional colorful substrate and the TFT substrate can be avoid, the difficulties of celling process during manufacturing procedure in display panel can be reduced, and the aperture ratio of pixel can be increased.

The foregoing descriptions of specific embodiments of the present invention have been presented for purpose of illustration and description. They are not intended to be exhaustive or to limit the invention to the precise forms disclosed, and many modifications and variations are possible in light of the above teaching. The embodiments were chosen and described in order to best explain the principles of the invention and its practical application, to modifications as are suited to the particular use contemplated. It is intended that the scope of the invention be defined by the claims appended hereto and their equivalents.

The invention claimed is:

1. A manufacturing method for COA substrate, comprising following steps:
    step 1. providing a TFT substrate which comprises a base substrate, a TFT layer disposed on the base substrate and a pixel electrode layer disposed on the TFT layer, wherein, the pixel electrode layer comprises a plurality of red subpixel electrodes, a plurality of green subpixel electrodes and a plurality of blue subpixel electrodes arranged in intervals;
    wherein, materials of the pixel electrode layer are PEDOT, PProDOT or PEDOT derivatives with or without doping with graphene, or PProDOT derivatives;

forming a block array inside interval regions of the plurality of red subpixel electrodes, green subpixel electrodes and blue subpixel electrodes located on the TFT layer;

step 2. providing a counter electrode layer, a reference electrode, a first electrolytic solution, a second electrolytic solution and a third electrolytic solution; the counter electrode layer comprises an insulating substrate and a plurality of counter electrode layer units disposed on the insulating substrate, and the counter electrode layer units are respectively disposed in corresponding to the plurality of red, green and blue subpixel electrodes; the first electrolytic solution is an organic electrolytic solution of red quantum dot which is modified by a modifier, the second electrolytic solution is an organic electrolytic solution of green quantum dot which is modified by a modifier, and the third electrolytic solution is organic electrolytic solution of scattering particles which are modified by a modifier; the reference electrode is processed calibration via ferrocene before being utilized;

the chemical structural formulas of the modifier is:

wherein, all $R_1$, $R_2$, $R_3$ are hydrocarbyl groups containing 1 to 20 carbon atoms;

step 3. immersing the counter electrode layer, the reference electrode and the TFT substrate into the first electrolytic solution simultaneously, controlling circuit via connecting to the TFT substrate, the counter electrode layer and the reference electrode by wires, and applying positive voltages to all red subpixel electrodes on the TFT substrate; under oxidation of a positive electric field after being powered on, the modifier on the red quantum dot inside the first electrolytic solution nearby the red subpixel electrodes on the TFT substrate undergoes crosslinking reaction with the red subpixel electrodes, and each modifier undergoes crosslinking reaction with each other at the same time to deposit the red quantum dot on the red subpixel electrodes for further forming several red filter layers on several red subpixel electrodes; controlling electric chemical depositing time to have the thicknesses of the red filter layers achieved to a certain amount, and then being powered off to obtain the TFT substrate, the counter electrode layer and the reference electrode, and then cleaning the TFT substrate, the counter electrode layer and the reference electrode with organic solution;

step 4 immersing the counter electrode layer, the reference electrode and the TFT substrate into the second electrolytic solution simultaneously, controlling circuit via connecting to the TFT substrate, the counter electrode layer and the reference electrode by wires, and applying positive voltages to all green subpixel electrodes on the TFT substrate; under oxidation of a positive electric field after being powered on, the modifier on the green quantum dot inside the second electrolytic solution nearby the green subpixel electrodes on the TFT substrate undergoes crosslinking reaction with the green subpixel electrodes, and each modifier undergoes crosslinking reaction with each other at the same time to deposit the green quantum dot on the green subpixel electrodes for further forming several green filter layers on several green subpixel electrodes;

controlling electric chemical depositing time to have the thicknesses of the green filter layers achieved to a certain amount, and then being powered off to obtain the TFT substrate, the counter electrode layer and the reference electrode, and then cleaning the TFT substrate, the counter electrode layer and the reference electrode with organic solution;

step 5 immersing the counter electrode layer, the reference electrode and the TFT substrate into the third electrolytic solution simultaneously, controlling circuit via connecting to the TFT substrate, the counter electrode layer and the reference electrode by wires, and applying positive voltages to all blue subpixel electrodes on the TFT substrate; under oxidation of a positive electric field after being powered on, the modifier on the scattering particles inside the third electrolytic solution nearby the blue subpixel electrodes on the TFT substrate undergoes crosslinking reaction with the blue subpixel electrodes, and each modifier undergoes crosslinking reaction with each other at the same time to deposit the scattering particles on the blue subpixel electrodes for further forming several blue filter layers on several blue subpixel electrodes; controlling electric chemical depositing time to have the thicknesses of the blue filter layers achieved to a certain amount, and then being powered off to obtain the TFT substrate, the counter electrode layer and the reference electrode, and then cleaning the TFT substrate, the counter electrode layer and the reference electrode with organic solution;

the step 3., step 4. and step 5 are processed randomly; after processing step 3.~step 5., a quantum dot color filter of several red filter layers, several green filter layers and glue filter layers can be obtained for further manufacturing a COA substrate.

2. A manufacturing method for COA substrate according to claim 1, wherein, materials of the pixel electrode layer are PEDOT with doping with graphene; the chemical structural formula of the modifier is:

wherein, $R_1$ is $CH_3$, R2 is $CH_2$, $R_3$ is

3. A manufacturing method for COA substrate according to claim 1, wherein, diameters of the red quantum dot, the green quantum dot and the scattering particles are 2 nm~10 nm, the red quantum dot is an InP quantum dot covered by ZnS; the green quantum dot is an InAs quantum dot covered by ZnS; the scattering particles dot are white, blue or transparent particles.

4. A manufacturing method for COA substrate according to claim 1, wherein, during the electric depositing process in the step 3. to step 5., the positive potential applying to the red/green/blue subpixel electrodes on the TFT substrate is a stable potential of the reference electrode in a constant voltage of 0.7V~2V with applying time of 0.1 s~100 min.

5. A manufacturing method for COA substrate according to claim 1, wherein, during the electric depositing process in the step 3. to step 5., the positive potential applying to the red/green/blue subpixel electrodes on the TFT substrate is the highest voltage which is a pulsed electrical potential of 0.7V~2V with applying time of 0.1 s~100 min.

6. A manufacturing method for COA substrate according to claim 5, wherein, during the electric depositing process in the step 3. to step 5., the positive potential applying to the red/green/blue subpixel electrodes on the TFT substrate is a square wave pulse with a wave crest of 1.1V, a crest time of 0.1 s, a wave trough of 0.4V and a trough time of is in repeating 15 times.

7. A manufacturing method for COA substrate according to claim 1, wherein, the manufacturing method for the first, the second and the third electrolytic solutions is: firstly, processing modifications the red quantum dot, the green quantum dot and the scattering particles with pyridine, inputting an amount of 1 μM~10 mM red quantum dot, green quantum dot and scattering particles into organic electrolytic solutions respectively, adding 1 μM~10 mM modifier into the organic electrolytic solution, and then stirring for 10 min~12 h to obtain the red quantum dot, the green quantum dot and the scattering particles modified by modifier respectively.

8. A manufacturing method for COA substrate according to claim 1, wherein, the organic electrolytic solution is an ionic liquid or an organic solution containing an organic salt; the reference electrode is a Ag/Ag+ reference electrode.

9. A manufacturing method for COA substrate according to claim 8, wherein, the organic electrolytic solution is a tetrahydrofuran/acetonitrile solution with 0.01M silver nitrate and 0.1M tetrabutylammonium hexafluorophosphate, wherein, the volume ratio between tetrahydrofuran and acetonitrile is 2:1; the solution inside the reference electrode comprises a tetrahydrofuran/acetonitrile solution of 0.15M tetrabutylammonium hexafluorophosphate and 0.001M silver nitrate, wherein, the volume ratio between tetrahydrofuran and acetonitrile is 2:1.

10. A manufacturing method for COA substrate according to claim 1, wherein, in the step 3.-step 5., the TFT substrate, the counter electrode layer and the reference electrode are cleaned by acetonitrile.

11. A manufacturing method for COA substrate, comprising following steps:
step 1. providing a TFT substrate which comprises a base substrate, a TFT layer disposed on the base substrate and a pixel electrode layer disposed on the TFT layer, wherein, the pixel electrode layer comprises a plurality of red subpixel electrodes, green subpixel electrodes and blue subpixel electrodes arranged in intervals;
wherein, materials of the pixel electrode layer are PEDOT, PProDOT or PEDOT derivatives with or without doping with graphene, or PProDOT derivatives;
forming a block array inside interval regions of the plurality of red subpixel electrodes, green subpixel electrodes and blue subpixel electrodes located on the TFT layer;
step 2. providing a counter electrode layer, a reference electrode, a first electrolytic solution, a second electrolytic solution and a third electrolytic solution; the counter electrode layer comprises an insulating substrate and a plurality of counter electrode layer units disposed on the insulating substrate, and the counter electrode layer units are respectively disposed in corresponding to the plurality of red, green and blue subpixel electrodes; the first electrolytic solution is an organic electrolytic solution of red quantum dot which is modified by a modifier, the second electrolytic solution is an organic electrolytic solution of green quantum dot which is modified by a modifier, and the third electrolytic solution is organic electrolytic solution of scattering particles which are modified by a modifier; the reference electrode is processed calibration via ferrocene before being utilized;
the chemical structural formulas of the modifier is:

wherein, all $R_1$, $R_2$, $R_3$ are hydrocarbyl groups containing 1 to 20 carbon atoms;
step 3. immersing the counter electrode layer, the reference electrode and the TFT substrate into the first electrolytic solution simultaneously, controlling circuit via connecting to the TFT substrate, the counter electrode layer and the reference electrode by wires, and applying positive voltages to all red subpixel electrodes on the TFT substrate; under oxidation of a positive electric field after being powered on, the modifier on the red quantum dot inside the first electrolytic solution nearby the red subpixel electrodes on the TFT substrate undergoes crosslinking reaction with the red subpixel electrodes, and each modifier undergoes crosslinking reaction with each other at the same time to deposit the red quantum dot on the red subpixel electrodes for further forming several red filter layers on several red subpixel electrodes; controlling electric chemical depositing time to have the thicknesses of the red filter layers achieved to a certain amount, and then being powered off to obtain the TFT substrate, the counter electrode layer and the reference electrode, and then cleaning the TFT substrate, the counter electrode layer and the reference electrode with organic solution;

step 4 immersing the counter electrode layer, the reference electrode and the TFT substrate into the second electrolytic solution simultaneously, controlling circuit via connecting to the TFT substrate, the counter electrode layer and the reference electrode by wires, and applying positive voltages to all green subpixel electrodes on the TFT substrate; under oxidation of a positive electric field after being powered on, the modifier on the green quantum dot inside the second electrolytic solution nearby the green subpixel electrodes on the TFT substrate undergoes crosslinking reaction with the green subpixel electrodes, and each modifier undergoes crosslinking reaction with each other at the same time to deposit the green quantum dot on the green subpixel electrodes for further forming several green filter layers on several green subpixel electrodes;

controlling electric chemical time to have the thicknesses of the green filter layers achieved to a certain amount, and then being powered off to obtain the TFT substrate, the counter electrode layer and the reference electrode, and then cleaning the TFT substrate, the counter electrode layer and the reference electrode with organic solution;

step 5 immersing the counter electrode layer, the reference electrode and the TFT substrate into the third electrolytic solution simultaneously, controlling circuit via connecting to the TFT substrate, the counter electrode layer and the reference electrode by wires, and applying positive voltages to all blue subpixel electrodes on the TFT substrate; under oxidation of a positive electric field after being powered on, the modifier on the scattering particles inside the third electrolytic solution nearby the blue subpixel electrodes on the TFT substrate undergoes crosslinking reaction with the blue subpixel electrodes, and each modifier undergoes crosslinking reaction with each other at the same time to deposit the scattering particles on the blue subpixel electrodes for further forming several blue filter layers on several blue subpixel electrodes; controlling electric chemical time to have the thicknesses of the blue filter layers achieved to a certain amount, and then being powered off to obtain the TFT substrate, the counter electrode layer and the reference electrode, and then cleaning the TFT substrate, the counter electrode layer and the reference electrode with organic solution;

the step 3., step 4. and step 5 are processed randomly; after processing step 3.~step 5., a quantum dot color filter of several red filter layers, several green filter layers and glue filter layers can be obtained for further manufacturing a COA substrate;

wherein, materials of the pixel electrode layer are PEDOT with doping with graphene; the chemical structural formula of the modifier is:

wherein, $R_1$ is $CH_3$, R2 is $CH_2$, $R_3$ is wherein, diameters of the red quantum dot, the green quantum dot and the scattering particles are 2 nm-10 nm, the red quantum dot is an InP quantum dot covered by ZnS; the green quantum dot is an InAs quantum dot covered by ZnS;

the scattering particles dot are white, blue or transparent particles;

wherein, the manufacturing method for the first, the second and the third electrolytic solutions is: firstly, processing modifications the red quantum dot, the green quantum dot and the scattering particles with pyridine, inputting an amount of 1 μM~10 mM red quantum dot, green quantum dot and scattering particles into organic electrolytic solutions respectively, adding 1 μM~10 mM modifier into the organic electrolytic solution, and then stirring for 10 min~12 h to obtain the red quantum dot, the green quantum dot and the scattering particles respectively modified by modifier;

wherein, the organic electrolytic solution is an ionic liquid or an organic solution containing an organic salt; the reference electrode is a Ag/Ag+ reference electrode.

12. A manufacturing method for COA substrate according to claim 11, wherein, during the depositing process in the step 3. to step 5., during the electric depositing process in the step 3. to step 5., the positive potential applying to the red/green/blue subpixel electrodes on the TFT substrate is a stable potential of the reference electrode in a constant voltage of 0.7V~2V with applying time of 0.1 s~100 min.

13. A manufacturing method for COA substrate according to claim 11, wherein, during the electric depositing process in the step 3. to step 5., the positive potential applying to the red/green/blue subpixel electrodes on the TFT substrate is the highest voltage which is a pulsed electrical potential of 0.7V~2V with applying time of 0.1 s~100 min.

14. A manufacturing method for COA substrate according to claim 13, wherein, during the electric depositing process in the step 3. to step 5., the positive potential applying to the red/green/blue subpixel electrodes on the TFT substrate is a square wave pulse with a wave crest of 1.1V, a crest time of 0.1 s, a wave trough of 0.4V and a trough time of is in repeating 15 times.

15. A manufacturing method for COA substrate according to claim 11, wherein, the organic electrolytic solution is a tetrahydrofuran/acetonitrile solution with 0.01M silver nitrate and 0.1M tetrabutylammonium hexafluorophosphate, wherein, the volume ratio between tetrahydrofuran and acetonitrile is 2:1; the solution inside the reference electrode comprises a tetrahydrofuran/acetonitrile solution of 0.15M tetrabutylammonium hexafluorophosphate and 0.001M silver nitrate, wherein, the volume ratio between tetrahydrofuran and acetonitrile is 2:1.

16. A manufacturing method for COA substrate according to claim 11, wherein, in the step 3.-step 5., the TFT substrate, the counter electrode layer and the reference electrode are cleaned by acetonitrile.

* * * * *